United States Patent
Wang et al.

(10) Patent No.: US 7,580,497 B2
(45) Date of Patent: Aug. 25, 2009

(54) CLOCK DATA RECOVERY LOOP WITH SEPARATE PROPORTIONAL PATH

(75) Inventors: Shoujun Wang, Kanata (CA); Haitao Mei, Kanata (CA); Bill Bereza, Nepean (CA); Tad Kwasniewski, Ottawa (CA)

(73) Assignee: Altera Corporation, San Jose, CA (US)

( * ) Notice: Subject to any disclaimer, the term of this patent is extended or adjusted under 35 U.S.C. 154(b) by 696 days.

(21) Appl. No.: 11/172,559

(22) Filed: Jun. 29, 2005

(65) Prior Publication Data
US 2007/0002993 A1 Jan. 4, 2007

(51) Int. Cl.
*H03D 3/24* (2006.01)
(52) U.S. Cl. .................. 375/374; 375/326; 375/376
(58) Field of Classification Search ................. 375/326, 375/374, 376
See application file for complete search history.

(56) References Cited

U.S. PATENT DOCUMENTS

| | | | | | |
|---|---|---|---|---|---|
| 4,118,674 | A | * | 10/1978 | Ball | 331/17 |
| 4,745,372 | A | * | 5/1988 | Miwa | 331/8 |
| 4,757,816 | A | * | 7/1988 | Ryan et al. | 607/32 |
| 6,396,890 | B1 | * | 5/2002 | Turner | 375/376 |
| 7,106,140 | B2 | * | 9/2006 | Mone | 331/16 |
| 2005/0030001 | A1 | | 2/2005 | Jasa et al. | |
| 2005/0134491 | A1 | * | 6/2005 | Huang et al. | 341/143 |
| 2005/0231297 | A1 | * | 10/2005 | Aparin et al. | 331/177 V |

OTHER PUBLICATIONS

Cao, J., et al., "OC-192 Receiver in Standard 0.18μm CMOS," *IEEE International Solid-State Circuits Conference 2002*, Digest of Technical Papers, pp. 250, 251, 464 (Feb. 2002).

Walker, R., et al., "A 2.488-Gbit/s Silicon Bipolar Clock and Data Recovery Circuit for SONET Fiber-Optic Communications Networks," *The Hewlett-Packard Journal*, vol. 48, No. 5, pp. 111-119 (Hewlett-Packard Co., Dec. 1997).

Greshishchev, Y.M., et al., "A fully integrated SiGe receiver IC for 10-Gb/s data rate," *IEEE J. Solid-State Circuits*, vol. 35, No. 12, pp. 1949-1957 (Dec. 2000).

Lee, J., et al., "Analysis and modeling of bang-bang clock and data recovery circuits," *IEEE J. Solid-State Circuits*, vol. 39, No. 9, pp. 1571-1580 (Sep. 2004).

(Continued)

*Primary Examiner*—Shuwang Liu
*Assistant Examiner*—Michael R Neff
(74) *Attorney, Agent, or Firm*—Ropes & Gray LLP; Jeffrey H. Ingerman

(57) ABSTRACT

A clock data recovery loop that can be used over a wide range of data rates and maintain second-order behavior includes a nonlinear (e.g., Bang-Bang) phase detector, a charge pump, an RC loop filter, and signal generator (e.g., a voltage controlled oscillator (VCO)). At low data rates, the loop may be operated with the charge pump and loop filter with stable second-order behavior, with the resistor R of the loop filter serving as a proportional path. A separate proportional path is also provided that provides phase detector output directly to a control input of the VCO, while the resistor R of the loop filter is also bypassed. As increasing data rates give rise to third-order effects, the separate proportional path may be activated to maintain second-order behavior.

9 Claims, 3 Drawing Sheets

OTHER PUBLICATIONS

Ramezani, M., et al., "Analysis of a Half-Rate Bang-Bang Phase-Locked-Loop," *IEEE Transactions on Circuits and Systems-II: Analog and Digital Signal Processing*, vol. 49, No. 7, pp. 505-509 (Jul. 2002).

Walker, R.C., "Designing bang-bang PLLs for clock and data recovery in serial data transmission systems," *Phase-locking in high-performance systems—from devices to architectures*, B. Razavi, Ed., pp. 34-45 (Wiley-IEEE Press, 2003).

* cited by examiner

CLOCK DATA RECOVERY LOOP WITH SEPARATE PROPORTIONAL PATH

BACKGROUND OF THE INVENTION

This invention relates to clock data recovery (CDR) applications. More particularly, this invention relates to a Bang-Bang CDR loop with a separate proportional path to improve loop stability.

It is almost axiomatic that digital systems are clocked. When sampling data in a digital system, it is important to have an accurate clock, so that the sampling can occur as close as possible to the center of the data eye for accurate reading of the data. This is relatively easy when the clock is sent along with the data. However, when the clock must be recovered from the data, clock recovery errors could make centering the sampling time in the data eye difficult or unreliable. Any such problems are compounded in a programmable logic device, where the circuit paths, as well as the clock recovery circuitry, differ from one user logic design to the next.

Clock recovery is commonly accomplished using a loop circuit—i.e., a phase-locked loop (PLL) or delay-locked loop (DLL)—in which a phase detector detects a phase variation between input and recovered signals, causing a charge pump to vary a control signal (i.e., voltage or current) of an oscillator or delay line (e.g., a voltage-controlled oscillator or current-controlled oscillator) to bring the recovered signal back into alignment with the input signal. Variation or ripple in the control signal may cause unacceptable jitter in the oscillator output, giving rise to clock recovery errors, which in turn result in data read errors.

One type of phase detector for a CDR loop is a nonlinear phase detector known as a Bang-Bang phase detector. When a Bang-Bang phase detector is used in a CDR loop circuit, the loop stability may be affected, particularly at high frequencies, by parasitic or other capacitance in parallel with the loop filter, which may give rise to third-order effects.

It would be desirable to be able to provide a Bang-Bang CDR loop with increased stability.

SUMMARY OF THE INVENTION

The present invention increases stability in a Bang-Bang CDR loop by providing alternate paths in the loop to be used in different frequency or data rate ranges. At relatively low frequencies or data rates, where the effect of the parasitic capacitance is small, the loop operates in a conventional manner, preferably with an RC loop filter. The effect of any parasitic or other capacitance that is in parallel with the loop filter is negligible. Thus, the loop operates as a well-understood, stable second-order loop, with the loop filter resistor R serving as a "proportional path" and the loop filter capacitor C serving as an "integral path."

At higher frequencies or data rates, the effect of the parasitic or other capacitance is more significant, and gives rise to third-order effects which degrade loop stability and make loop design difficult. The effect can be reduced, and stability enhanced, by increasing the capacitance in the loop filter, making the parasitic or other capacitance less significant. However, while off-chip solutions (using an off-chip capacitor, which can be as large as necessary, in the loop filter) are available, increasing the capacitance is difficult in an on-chip solution, because of the device area requirements of a larger capacitor.

This invention provides an on-chip solution for a CDR circuit capable of operating in a stable, second-order mode over a wide range of data rates by introducing a separate proportional path at higher data rates. Thus, at lower data rates, the circuit operates conventionally as described above. At higher data rates, the resistor in the RC loop filter may be bypassed. This has the effect of creating a single capacitance (the parallel combination of the actual capacitor of the RC loop filter and the parasitic capacitance), returning the loop to a second-order condition. Because the resistor served as the proportional path as described above, when the resistor is bypassed, the Bang-Bang signal output of the Bang-Bang phase detector also is input directly to the signal generator (e.g., a voltage-controlled oscillator) of the loop circuit over a separate proportional path, bypassing the charge pump and loop filter. A varactor, which preferably is sized to generate a small frequency step (as discussed in more detail below), may be provided at that input, and receives the Bang-Bang signal output. This allows the output of the Bang-Bang phase detector to control the signal generator.

Therefore, in accordance with the present invention, there is provided a loop circuit including a primary loop having a signal generator for generating an output of the loop circuit, a phase detector accepting as inputs the output and a data signal and providing at least one phase error signal, a charge pump responsive to that at least one phase error signal, a loop filter charged up by the charge pump and including a resistor and a capacitor and providing a loop filter output for input to the signal generator, a bypass circuit for controllably bypassing the resistor, and an alternate path for controllably conducting the phase error signal directly to the signal generator. At low data rates, the resistor serves as a proportional path of the loop circuit, while at high data rates the alternate path serves as a separate proportional path. A secondary loop may be provided for frequency acquisition. A method of operating the loop circuit is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1-4.

Figure 1:
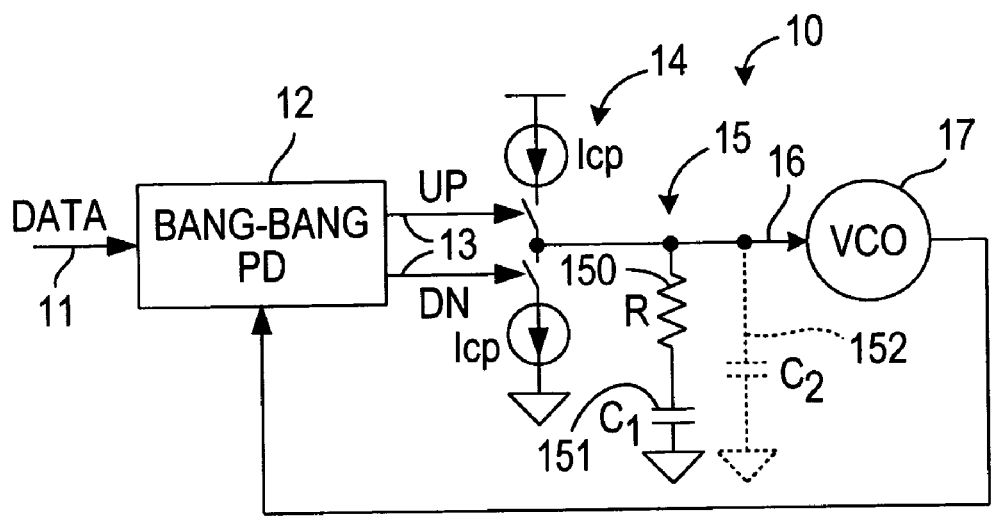
FIG. 1 is a schematic representation of a Bang-Bang CDR loop with a conventional RC loop filter.

FIG. 1 shows a conventional Bang-Bang CDR loop 10 in which data 11 is input to Bang-Bang phase detector 12, resulting in UP/DOWN Bang-Bang control signals 13 controlling charge pump 14. Charge pump 14 charges and discharges loop filter 15, which includes resistor R (150) and capacitor $C_1$ (151). Loop filter 15 provides control signal 16 that controls a signal generator such as voltage-controlled oscillator (VCO) 17. The output of the signal generator (e.g., of VCO 17) preferably is fed back to phase detector 12 where its phase is compared to the phase of data signal 11 to generate control signals 13. In this known loop, resistor R (150) serves as a "proportional" path while capacitor $C_1$ (151) serves as an "integral" path.

The foregoing description of loop 10 describes an ideal case. In reality, parasitic and other capacitances (e.g., the capacitance of a varactor that may be provided at the input to VCO 17), shown in phantom as capacitor $C_2$ (152) turn the loop 10, which in the ideal case may be described as a "2nd-order" loop having well-understood stable behavior, into a "3rd-order" loop having more complex and less stable behavior.

Figure 2:
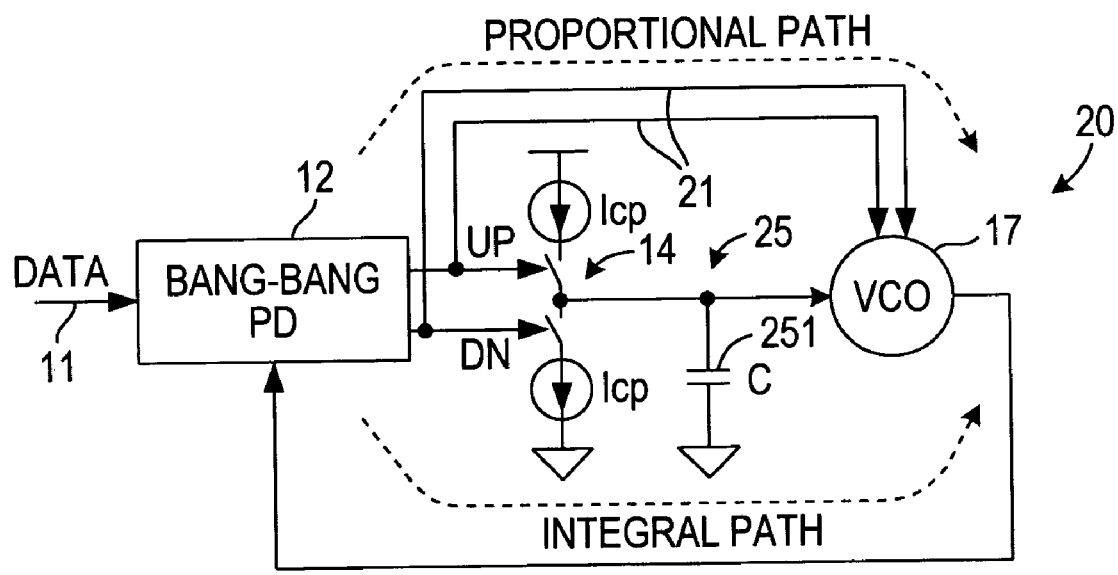
FIG. 2 is a schematic representation of a Bang-Bang CDR loop with an explicit separate proportional path.

An alternative embodiment of a Bang-Bang CDR loop 20 is shown in FIG. 2. In this embodiment, the resistor R is eliminated from the loop filter 25 which includes only capacitor C (251). In place of R, a separate proportional path 21 carries the output of Bang-Bang phase detector 12 directly to the input of VCO 17 (or other signal generator).

As stated above, in loop 10, resistor R may be considered to be a proportional path. In either loop 10 or loop 20, if the phase change in the proportional path is represented by $\Delta\theta_b$ and the phase change in the integral path is represented by $\Delta\theta_i$, then the loop stability $\xi$ may be defined as the ratio between $\Delta\theta_b$ and $\Delta\theta_i$:

$$\xi = \Delta\theta_b/\Delta\theta_i$$

In the case of loop 10 at low data rates, where the effect of $C_2$ is negligible:

$$\xi_{2nd-order} = \Delta\theta_b/\Delta\theta_i = 2RCf_{baud},$$

where $f_{baud}$ is the frequency or data rate of the incoming data. In the case of loop 20, $$\xi_{2nd-order} = \Delta\theta_b/\Delta\theta_i = 2Cf_{bb}f_{baud}/(I_{cp}Kvco).$$

where $f_{bb}$ is the Bang-Bang step frequency of phase detector 11, $I_{cp}$ is the charge pump current, and Kvco is the VCO gain. The parasitic capacitance does not appear because $C_1$ and $C_2$ collapse into a single capacitance C (the combination of two parallel capacitances). Comparison of the two foregoing expressions shows that at low frequencies or data rates, $f_{bb}$, or more particularly $f_{bb}/(I_{cp}Kvco)$, takes the place of R, and the stability remains proportional to R.

At higher frequencies or data rates, however, the effect of $C_2$ is no longer negligible, and its presence begins to have an effect, turning the system into a third-order system. Treating the resulting effective resistance $R_{new}$ and capacitance $C_{new}$ as complex numbers yields:

$$R_{new}C_{new} = RC_1^2/(C_1 + C_2 + R^2C_1^2C_2\omega^2).$$

As a result, $$\xi_{3rd-order} = 2R_{new}C_{new}f_{baud}$$
$$= 2RC_1^2/(C_1 + C_2 + 4\pi^2R^2C_1^2C_2f_{baud}^2).$$

Similarly, $$f_{bb} = I_{cp}R_{new}K_{VCO}$$
$$= I_{cp}K_{VCO}RC_1^2/((C_1 + C_2)^2 + 4\pi^2R^2C_1^2C_2^2f_{baud}^2),$$

from which it may be appreciated that at higher data rates, stability, which at lower data rates is directly proportional to R, becomes inversely proportional to R.

It can be shown that for a third-order loop, at relatively low data rates (e.g., about 1 Gbps), if $C_2=C_1/1000$, jitter is within tolerance specifications and larger R improves jitter tolerance. On the other hand, at higher data rates (e.g., about 3.125 Gbps), if $C_2=C_1/1000$, jitter is barely tolerable and smaller R improves jitter tolerance. This makes designing a third-order loop for a wide range of data rates difficult.

On the other hand, for a second-order loop with a separate proportional path, the upper limit of $f_{bb}$ is determined by the self-generated hunting jitter, which is proportional to $f_{bb}/f_{baud}$. Thus, designing a wide-range Bang-Bang CDR loop with a separate proportional path and maintaining jitter within tolerance is relatively straightforward and can be accomplished by keeping an appropriate ratio of $f_{bb}/f_{baud}$—e.g., $$f_{bb}/f_{baud} = 1/1000.$$

Figure 3:
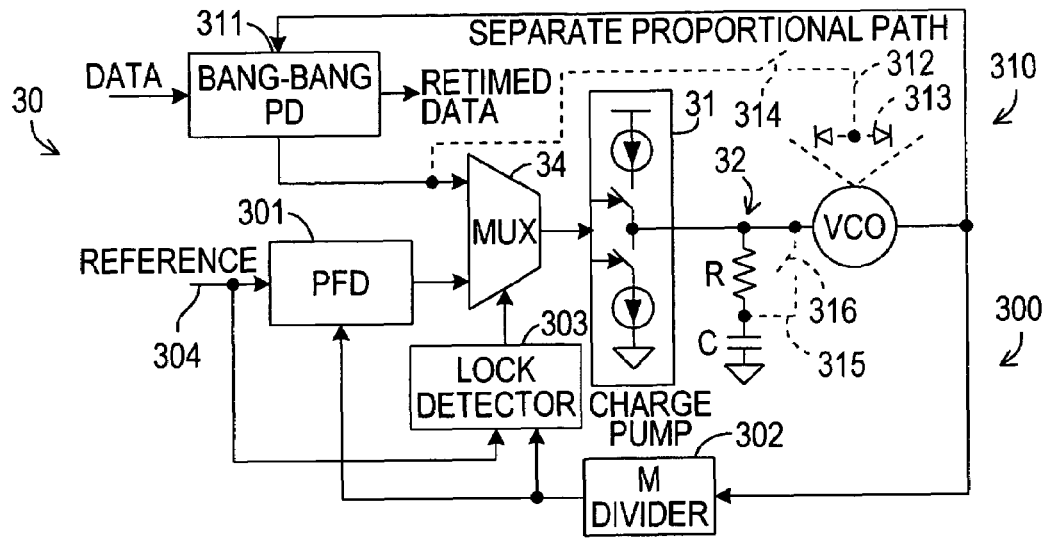
FIG. 3 is a schematic representation of a circuit including a preferred embodiment of a Bang-Bang CDR loop in accordance with the present invention as well a frequency acquisition loop.

A preferred practical embodiment of a wide-range Bang-Bang CDR circuit 30 is shown in FIG. 3. CDR circuit 30 preferably employs a dual-loop architecture. Preferably, lower, secondary loop 300 is used at start-up to bring the frequency within acquisition range of upper, primary loop 310, which then is used for clock data recovery (at least until lock is lost). Loops 300 and 310 preferably share conventional charge pump 31, conventional RC loop filter 32, and VCO 33 (although other types of signal generator, such as a current-controlled oscillator, may be used with minor modifications as would be apparent to one of ordinary skill).

Loop 300 also includes phase-frequency detector 301 and feedback counter/divider 302 which divides the fed-back output signal by M to multiply the output frequency by M, as is well known in frequency synthesis. Lock detector 303 preferably compares the feedback signal to input reference signal 304, and when a frequency-lock is detected, switches circuit 30 to loop 310 by selecting the output of Bang-Bang phase detector 311 using multiplexer 34. Loop 310 remains selected as long as a phase lock is maintained.

At sufficiently low input data rate $f_{baud}$, loop 310 operates as a conventional second-order loop with RC loop filter 32. However, loop 310 preferably also has an optional separate proportional path 312 from the output of Bang-Bang phase detector 311 to the input of VCO 33. A small varactor 313 directly controlled by the Bang-Bang signal is preferably provided in path 312 to secondary frequency control 42 of VCO 33 (see FIG. 4). Preferably the varactor is sized to provide a frequency step $f_{bb}$ that meets the relationship discussed above—viz., $f_{bb}/f_{baud}=1/1000$. When proportional path 312 is activated by closing switch 314, a separate bypass path 315 also is activated by closing switch 316 to take resistor R (150) of loop filter 32 out of the circuit.

Any given circuit 30 can be used up to a certain data rate (which is a function of the parameters of the particular circuit) with stable, predictable results. Preferably, until that data rate is exceeded, loop 300 is used conventionally with charge pump 31 and loop filter 32. However, once that data rate is exceeded, switches 313, 316 are closed to bypass resistor R (150) and activate separate proportional path 312 to maintain second-order behavior.

Figure 4:
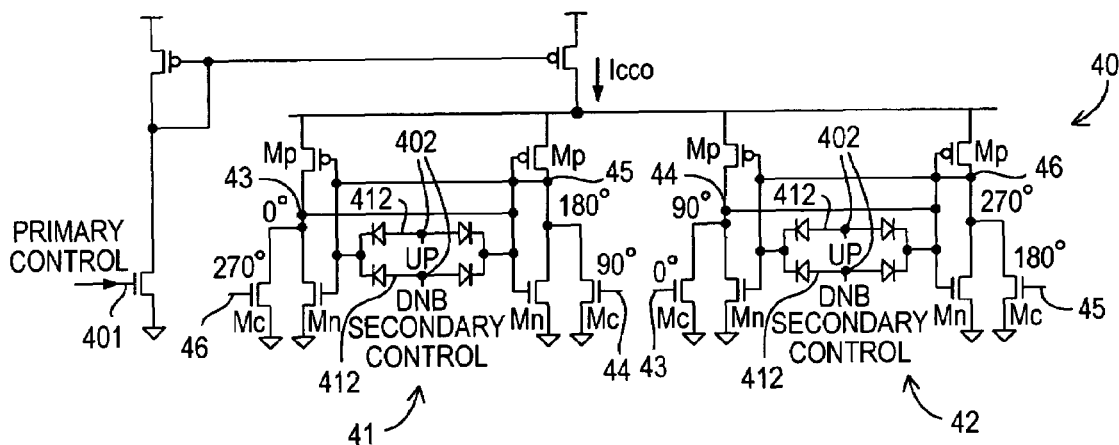
FIG. 4 is a schematic representation of a first exemplary voltage-controlled oscillator having two control inputs, which may be used in the present invention.

FIG. 4 shows a first exemplary embodiment 40 of a VCO 33 that can be used in loop circuits according to the present invention. VCO 40 preferably is a quadrature ring VCO preferably having two identical cross-coupled delay stages 41, 42. VCO 40 preferably provides quadrature phase clocks 43-46, and therefore preferably is suitable for half-rate Bang-Bang CDR applications.

VCO 40 preferably has two control inputs 401, 402. Control 401 preferably is the primary control, which preferably comes from loop filter 32. Control 402 preferably is the secondary control, which preferably comes from the Bang-Bang proportional path. Primary control 401 preferably determines the VCO tuning range while secondary control 402 (preferably including separate up and down signals UP and DNB) preferably determines the Bang-Bang step frequency $f_{bb}$. Because $f_{bb}$ is on the order of 0.1% of the VCO center frequency as discussed above, the size of varactors 412 of secondary control 402 need be only large enough to provide such a step frequency.

Figure 5:
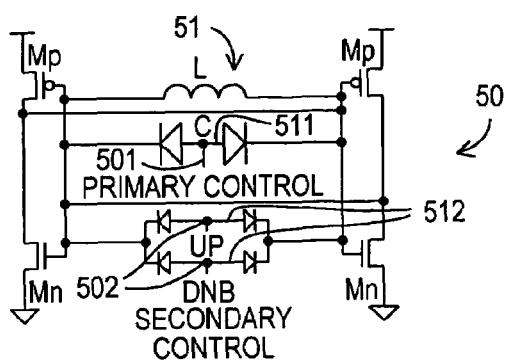
FIG. 5 is a schematic representation of a second exemplary voltage-controlled oscillator having two control inputs, which may be used in the present invention.

FIG. 5 shows a second exemplary embodiment 50 of a VCO 33 that can be used in loop circuits according to the present invention. VCO 50 preferably is based on LC tank 51 with a larger varactor 511 proving the primary control 501 and smaller varactors 512 proving the secondary control 502. As shown, VCO 50 is designed for full-rate CDR operation. However, a quadrature LC VCO (not shown) for half-rate operation can be configured as two cross-coupled stages in a manner similar to that used in quadrature ring VCO 40.

Figure 6:
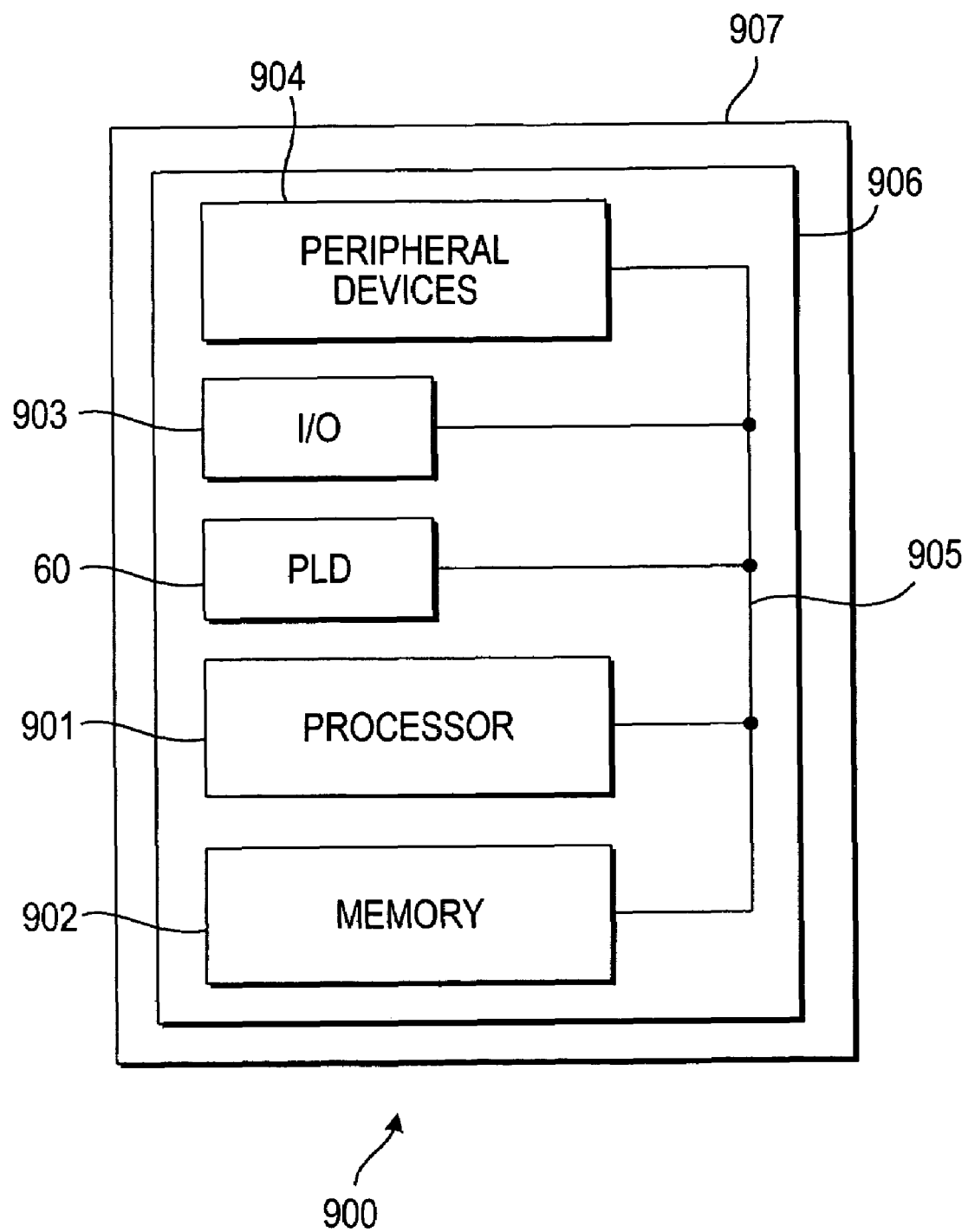
FIG. 6 is a schematic representation of a system including a programmable logic device incorporating the present invention.

A programmable logic device ("PLD") 60 incorporating clock data recovery circuitry according to the present invention may be used in many kinds of electronic devices. One possible use is in a data processing system 900 shown in FIG. 6. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 60 can be used to perform a variety of different logic functions. For example, PLD 60 can be configured as a processor or controller that works in cooperation with processor 901. PLD 60 may also be used as an arbiter for arbitrating access to a shared resources in system 900. In yet another example, PLD 60 can be configured as an interface between processor 901 and one of the other components in system 900. It should be noted that system 900 is only exemplary, and that the true scope and spirit of the invention should be indicated by the following claims.

Various technologies can be used to implement PLDs 50 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A loop circuit for clock data recovery over a wide range of data rates, said loop circuit comprising:
a signal generator for generating an output of said loop circuit;
a phase detector accepting as inputs said output and a data signal, and providing at least one phase error signal;
a charge pump responsive to said at least one phase error signal;
a loop filter charged up by said charge pump and comprising a resistor and a capacitor and providing a loop filter output for input to said signal generator;
a bypass circuit for controllably bypassing said resistor in a first range of data rates; and
an alternate path, separate from said bypass circuit, for controllably conducting said phase error signal to said signal generator when said resistor is bypassed, said alternate path bypassing said charge pump and said loop filter;
whereby:
in a second range of data rates lower than said first range of data rates said resistor is not bypassed and serves as a proportional path of said loop circuit; and
in said first range of data rates said alternate path serves as a separate proportional path.

2. The loop circuit of claim 1 wherein said signal generator comprises a voltage-controlled oscillator.

3. The loop circuit of claim 2 wherein said alternate path comprises a varactor.

4. The loop circuit of claim 1 wherein said phase detector is nonlinear.

5. The loop circuit of claim 4 wherein said nonlinear phase detector is a Bang-Bang phase detector.

6. The loop circuit of claim 1 wherein:
said signal generator, said phase detector, said charge pump, said loop filter, said bypass circuit and said alternate path form a primary loop; said loop circuit further comprising a secondary loop, said secondary loop including:
a feedback counter for dividing said output signal;
a phase-frequency detector accepting as inputs said divided output signal and a reference signal and outputting a phase-frequency error signal; and
a selector for selecting between said phase error signal and said phase-frequency error signal as an input to said charge pump; whereby:
said selector selects said phase-frequency error signal to activate said secondary loop for frequency acquisition, and selects said phase error signal to activate said primary loop for clock data recovery operation.

7. The loop circuit of claim 6 further comprising a lock detector for controlling said selector, said lock detector accepting as inputs said reference signal and output of said feedback counter.

8. A method for operating a loop circuit, said loop circuit having a primary loop including a signal generator for generating an output of said loop circuit, a phase detector accepting as inputs said output and a data signal and providing at least one phase error signal, a charge pump responsive to said at least one phase error signal, a loop filter charged up by said charge pump and comprising a resistor and a capacitor and providing a loop filter output for input to said signal generator, a bypass circuit for controllably bypassing said resistor, and an alternate path separate from said bypass circuit for controllably conducting said phase error signal to said signal generator when said resistor is bypassed, said alternate path bypassing said charge pump and said loop filter; said method comprising:
when said data signal has a frequency in a first frequency range, operating said controllable bypass circuit to not bypass said resistor and operating said controllable alternate path, separately from operating said bypass circuit, to not conduct said phase error signal to said signal generator; and
when said data signal has a frequency in a second frequency range higher than said first frequency range, operating said controllable bypass circuit to bypass said resistor and operating said controllable alternate path, separately from operating said bypass circuit, to conduct said phase error signal to said signal generator.

9. The method of claim 8 further comprising:
providing a secondary loop, said secondary loop including:
a feedback counter for dividing said output signal,
a phase-frequency detector accepting as inputs said divided output signal and a reference signal and outputting a phase-frequency error signal, and
a selector for selecting between said phase error signal and said phase-frequency error signal as an input to said charge pump;

operating said selector to select said phase-frequency error signal to activate said secondary loop to bring frequency within acquisition range of said primary loop; and
upon bringing frequency within acquisition range of said primary loop, operating said selector to select said phase error signal, activate said primary loop and deactivate said secondary loop.

\* \* \* \* \*

UNITED STATES PATENT AND TRADEMARK OFFICE
CERTIFICATE OF CORRECTION

PATENT NO. : 7,580,497 B2
APPLICATION NO. : 11/172559
DATED : August 25, 2009
INVENTOR(S) : Wang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1092 days.

Signed and Sealed this

Fourteenth Day of September, 2010

David J. Kappos
*Director of the United States Patent and Trademark Office*